United States Patent
Evans et al.

(10) Patent No.: US 8,923,090 B1
(45) Date of Patent: Dec. 30, 2014

(54) ADDRESS DECODING CIRCUITS FOR REDUCING ADDRESS AND MEMORY ENABLE SETUP TIME

(71) Applicant: LSI Corporation, San Jose, CA (US)

(72) Inventors: Donald A. Evans, Carroll, OH (US); Rasoju V. Chary, Bangalore (IN); Jeffrey C. Herbert, Milpitas, CA (US); Rahul Sahu, Bangalore (IN); Rajiv K. Roy, Bangalore (IN)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 14/035,164

(22) Filed: Sep. 24, 2013

(51) Int. Cl.
*G11C 8/00* (2006.01)
*G11C 8/10* (2006.01)

(52) U.S. Cl.
CPC .......................................... *G11C 8/10* (2013.01)
USPC ............ 365/230.06; 365/230.08; 365/189.02; 365/233.1; 365/233.14; 365/189.03

(58) Field of Classification Search
CPC .... G11C 11/401; G11C 29/50; G11C 7/1018; G11C 11/406; G11C 11/4085; G11C 29/028; G11C 29/44; G11C 29/50016; G11C 5/00; G11C 5/06; G11C 29/14; G11C 7/1072; G11C 7/22
USPC ............. 365/230.06, 230.08, 189.02, 233.14, 365/189.03, 189.04, 233.1
See application file for complete search history.

(56) References Cited

U.S. PATENT DOCUMENTS

| | | | |
|---|---|---|---|
| 6,009,038 A | 12/1999 | Koshizuka | |
| 6,026,036 A | 2/2000 | Sekiya et al. | |
| 6,304,510 B1 | 10/2001 | Nobunaga et al. | |
| 7,889,573 B2 | 2/2011 | Niimi et al. | |
| 2004/0196719 A1* | 10/2004 | Aritomi et al. | 365/222 |

* cited by examiner

*Primary Examiner* — Thong Q Le
(74) *Attorney, Agent, or Firm* — Sheridan Ross P.C.

(57) ABSTRACT

A decoder circuit to decode an address for accessing a memory cell in a memory array includes address latch circuitry, inverter circuitry, and first address pre-decode circuitry. The address latch circuitry receives an address signal and generates address holding signals during a setup period. The address latch circuitry latches the address holding signals during an address hold period following the setup period. The inverter circuitry receives the address signal and generates a complementary address signal. The first address pre-decode circuitry decodes the address signal and the address holding signals during the setup period to generate a first pre-decode address signal at an output of the first address pre-decode circuitry. In addition, the first address pre-decode circuitry decodes the address holding signals during the address hold period to maintain the first pre-decode address signal at the output of the first address pre-decode circuitry.

21 Claims, 7 Drawing Sheets

200

208-0

210-0

210-0

ADDRESS DECODING CIRCUITS FOR REDUCING ADDRESS AND MEMORY ENABLE SETUP TIME

FIELD OF THE INVENTION

The field generally relates generally to semiconductor memory devices, and more particularly, to circuits and methods for decoding address signals with reduced setup time.

BACKGROUND

A semiconductor memory device typically includes an array of memory cells arranged in rows and columns, with each memory cell configured to store one or more bits of data. The memory cells within a given row of the array are coupled to a common wordline, while the memory cells within a given column of the array are coupled to a common bitline. Thus, the array includes a memory cell at each point where a wordline intersects with a bitline. One or more memory cells can be selected for writing data thereto or reading data therefrom by applying appropriate row and column addresses to row and column decoders. In conventional memory designs, row and/or column decoders include address hold latches and pre-decoder logic, wherein input addresses are applied to the address hold latches, and wherein true and complement outputs of the address hold latches drive inputs of the pre-decoder logic. The outputs of the pre-decoder logic can then be sampled by the clock signal to begin a memory array access operation. For high-performance memories, parameter such as "setup time" and "hold time" are critical timing parameters that are specified for a given design. The setup time is defined as the minimum amount of time prior to an active edge of a clock signal that an address must be stable for the address to be correctly latched. The address hold time is defined as the minimum amount of time after the active edge of the clock signal during which address must be stable. In general, depending on the design priorities, a reduction in setup time can be achieved at the expense of increased access time, or vice versa. This tradeoff occurs when the clock signal is introduced in an address path. Consequently, circuit designers will compromise on access or hold time to improve the setup time, which is undesirable.

SUMMARY

In an embodiment of the invention, a decoder circuit to decode an address for accessing a memory cell in a memory array includes address latch circuitry, inverter circuitry, and first address pre-decode circuitry. The address latch circuitry receives as input an address signal and generates address holding signals during a setup period of the memory array. The address latch circuitry latches the address holding signals during an address hold period following the setup period. The inverter circuitry receives as input the address signal and generates a complementary address signal. The first address pre-decode circuitry receives as input the address signal, the complementary address signal and the address holding signals. The first address pre-decode circuitry decodes the address signal and complementary address signal during the setup period to generate a first pre-decode address signal at an output of the first address pre-decode circuitry. In addition, the first address pre-decode circuitry decodes the address holding signals during the address hold period to maintain the first pre-decode address signal at the output of the first address pre-decode circuitry.

Other embodiments of the invention will become apparent.

WRITTEN DESCRIPTION

Figure 1:
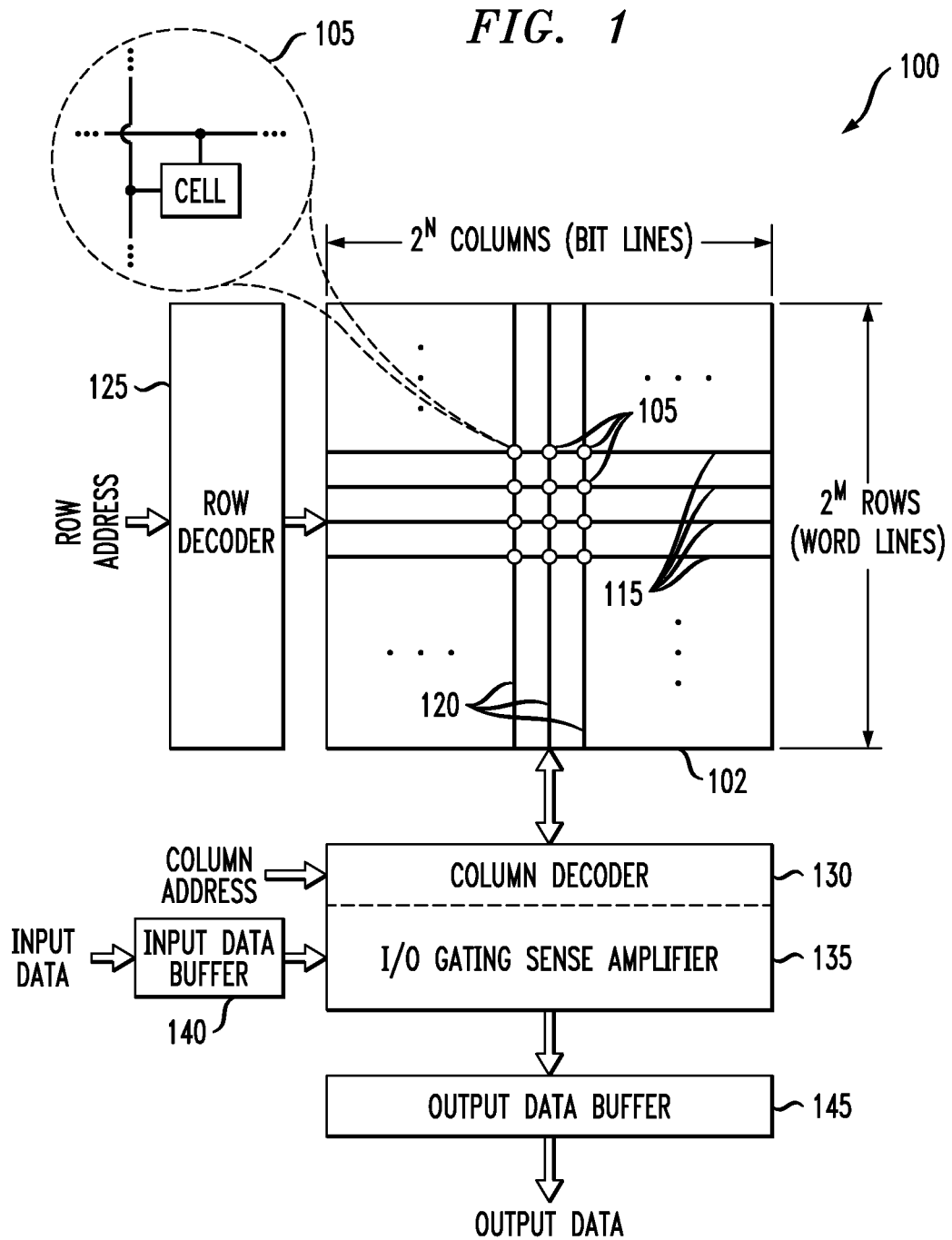
FIG. 1 is a schematic illustration of a semiconductor memory device comprising a memory array, and row and column decoders that incorporate address decoding circuitry according to embodiments of the invention.

FIG. 1 is a schematic illustration of a semiconductor memory device comprising a memory array and row and column decoders that incorporate address decoding circuitry according to embodiments of the invention. The memory device 100 comprises a memory array 102. The memory array 102 comprises a plurality of memory cells 105 each configured to store data. For example, the memory cells may each be configured to store a single bit of data, and such memory cells are also referred to herein as bit-cells. Each cell 105 is coupled to a corresponding row or wordline 115 and column or bitline 120. The memory array therefore includes a memory cell at each point where a wordline intersects with a bitline. The memory cells of the memory array are illustratively arranged in $2^N$ columns and $2^M$ rows. The values selected for N and M in a given implementation will generally depend upon on the data storage requirements of the application in which the memory device is utilized.

Particular ones of the memory cells 105 of the memory array 102 can be activated for writing data thereto or reading data therefrom by application of appropriate row and column addresses to respective row decoder 125 and column decoder 130. Other elements of the memory device 100 include an input/output (I/O) gating and sense amplifier element 135, an input data buffer 140 and an output data buffer 145. Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the gating and sense amplifier 135, or the input and output data buffers 140 and 145.

Conventional embodiments and operations of the memory device elements such as row decoder 125, column decoder 130, gating and sense amplifier 135 and buffers 140, 145 are well understood in the art and will not be described in detail herein. However, embodiments of the invention—as discussed in further detail below with reference to FIGS. 2, 3, 4, 5 and 6—include address decoding circuits and methods that are implemented by the row decoder 125 and/or column decoder 130 to reduce address setup time for pre-decoding address signals, without impacting memory access time.

It should be noted that the memory device 100 in one or more of the illustrative embodiments is assumed to comprise an SRAM device. However, embodiments of the invention can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. In addition, other types of memory cell configurations may be used. For example, the memory cells 105 in the memory array 102 could be multi-level cells each configured to store more than one bit of data. The invention is thus not limited in terms of the particular storage or access mechanism utilized in the memory device.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing the invention.

Embodiments of the invention will now be discussed in further detail with regard to address decoding circuits and techniques that are implemented in row and/or column decoder logic circuitry, which enable a reduction in the critical timing parameter of address setup time, without having to increase or otherwise adversely impact other critical timing parameters such as address hold time and memory access time.

Figure 2:
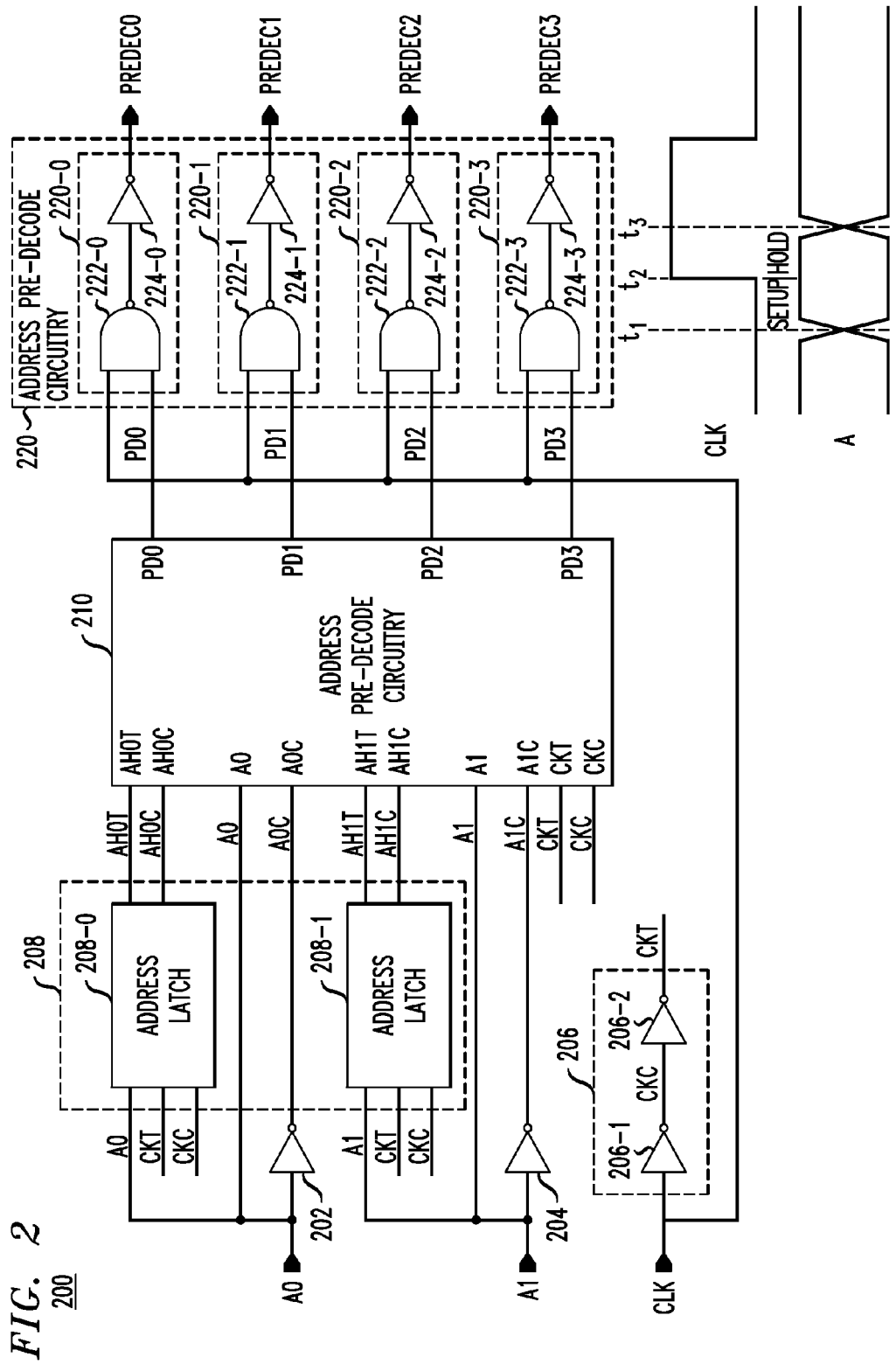
FIG. 2 is a block diagram of an address decoding circuit according to an embodiment of the invention.
Figure 3:
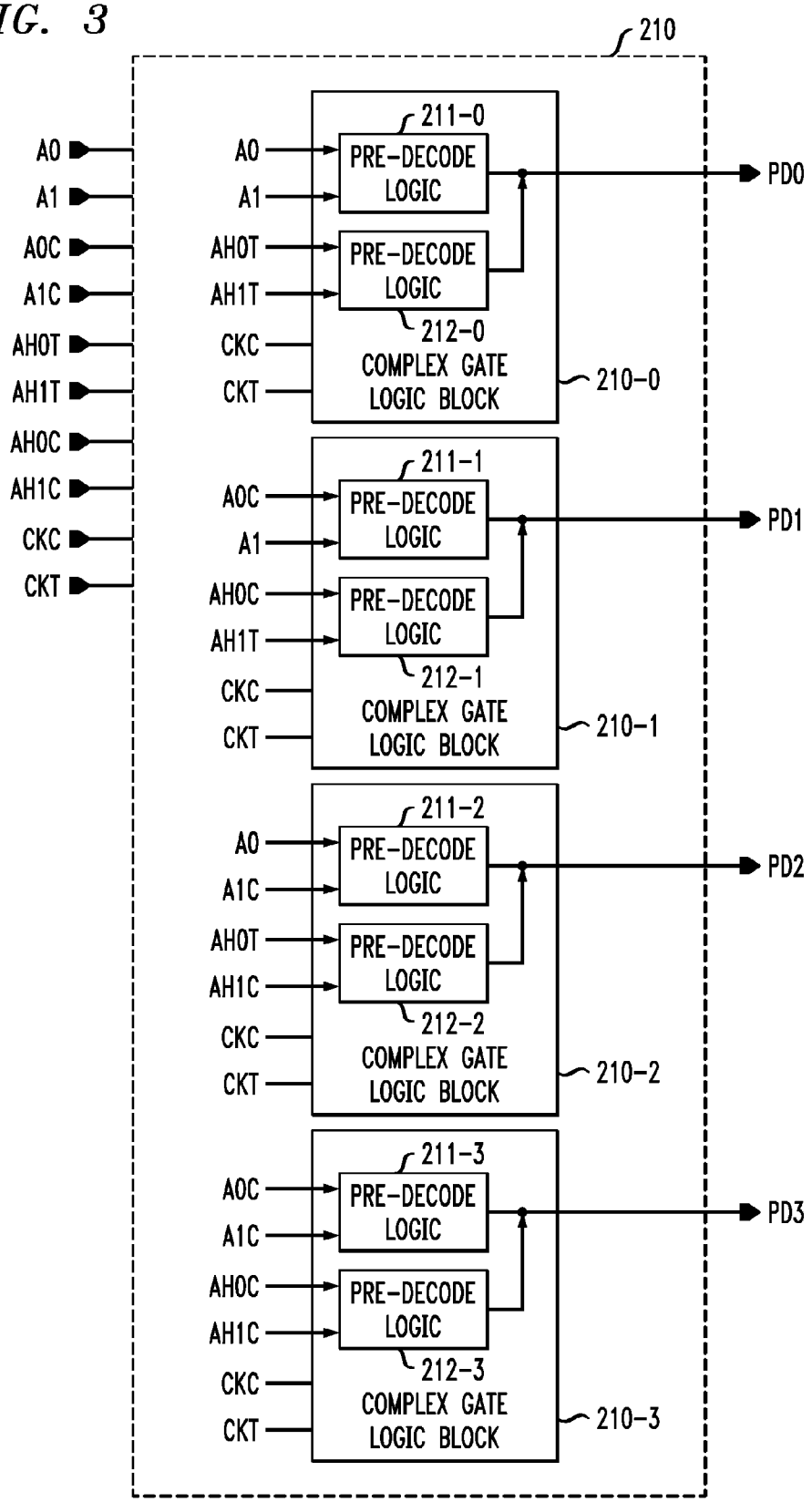
FIG. 3 is a block diagram of address pre-decoding circuitry comprising a plurality of complex gate logic blocks, according to an embodiment of the invention.

FIG. 2 is a block diagram of an address decoding circuit according to an embodiment of the invention. In particular, FIG. 2 illustrates an address decoding circuit 200 comprising a plurality of inverters 202 and 204, a clock buffer 206, address latch circuitry 208, first address pre-decode circuitry 210, and second address pre-decode circuitry 220. The address latch circuitry 208 comprises a plurality of address latches 208-0 and 208-1. The clock buffer 206 comprises a first inverter 206-1 and a second inverter 206-2. In one embodiment of the invention as shown in FIG. 3, the first address pre-decode circuitry 210 comprises a plurality of complex gate logic blocks 210-0, 210-1, 210-2, and 210-3. The complex gate logic blocks 210-0, 210-1, 210-2, and 210-3 include respective first pre-decode logic portions 211-0, 211-2, 211-2, and 211-3, and second pre-decode logic portions 212-0, 212-1, 212-2, and 212-3. Moreover, in one embodiment of the invention as shown in FIG. 2, the second address pre-decode circuitry 220 comprises a plurality of pre-decode blocks 220-0, 220-1, 220-2, and 220-3. Each pre-decode block 220-0, 220-1, 220-2, and 220-3 comprises a respective NAND gate 222-0, 222-1, 222-2, and 222-3, and a respective output inverter 224-0, 224-1, 224-2, and 224-3.

The clock buffer 206 receives as input a clock signal CLK and generates internal clock signals including a complementary clock signal CKC at an output of the first inverter 206-1, and a true clock signal CKT at an output of the second inverter 206-2. In one embodiment of the invention, the clock signal CLK is an external signal that is generated external to the address decoding circuit 200 and input to the address decoding circuit 200. The internal clock signals CKT and CTC are commonly input to the address latch circuitry 208 and the first address pre-decode circuitry 210. As explained below, the internal clock signals CKT and CKC are used as gate control signals to control the address latches 208-0 and 208-1 and the complex gate logic blocks 210-0, 210-1, 210-2, and 210-3 (FIG. 3). The clock signal CLK is input to the second address pre-decode circuitry 220 and is used by each pre-decode block 220-0, 220-1, 220-2, and 220-3 to sample a respective pre-decode input signal PD0, PD1, PD2, and PD3 output from the first address pre-decode circuitry 210, and generate a respective pre-decode output signal PREDEC0, PREDEC1, PREDEC2, and PREDEC3.

FIG. 2 further shows a portion the clock signal CLK and its relation to an address "setup" time and an address "hold" time with regard to an address signal A. In general, the term "setup" time as used herein refers to a minimum time interval prior to an active edge of the clock signal CLK that the address signal A must be stable for the address signal A to be correctly latched by address latch circuitry 208. In FIG. 2, the setup time is illustrated by a time period from $t_1$ to $t_2$. Moreover, in one embodiment as shown in FIG. 2, an active edge of the clock signal CLK is shown as a rising edge of the clock signal CLK at time $t_2$. Moreover, the term address "hold" time as used herein refers to a minimum time interval after an active edge of the clock signal CLK that the latched address signal A must be held stable to enable proper pre-decoding operations. In FIG. 2, the address hold time is illustrated by a time period from $t_2$ to $t_3$ following the active rising edge of the clock signal CLK.

In general, the address decoding circuit 200 operates as follows. The address decoding circuit 200 receives as input an n-bit address signal. In one embodiment of the invention, the n-bit address signal is generated by another circuit block and input to the address decoding circuit 200. In one embodiment as shown in FIG. 2, the address signal is a 2-bit signal <A1, A0>, although in alternate embodiments of the invention, address decoding circuit 200 can process a 3-bit (or greater) address signal. As shown in FIG. 2, the address bit A0 is concurrently input to the inverter 202, the first address latch 208-0, and the address pre-decode circuitry 210. Similarly, the address bit A1 is concurrently input to the second address latch 208-1, the second inverter 204, and the address pre-decode circuitry 210. At some time during a period in which the clock signal CLK is logic "0", the address decoding circuit 200 begins an address "setup" phase of operation in which the n-bit address signal is latched by the address latching circuitry 208, and the first address pre-decode circuitry 210 generates an $2^n$-bit pre-decode address signal at the output thereof. For the 2-bit address signal <A1, A0> as shown in FIG. 2, the address pre-decode circuitry 210 generates a 4-bit pre-decoded address signal <PD0, PD1, PD2, PD3>.

Figure 4:
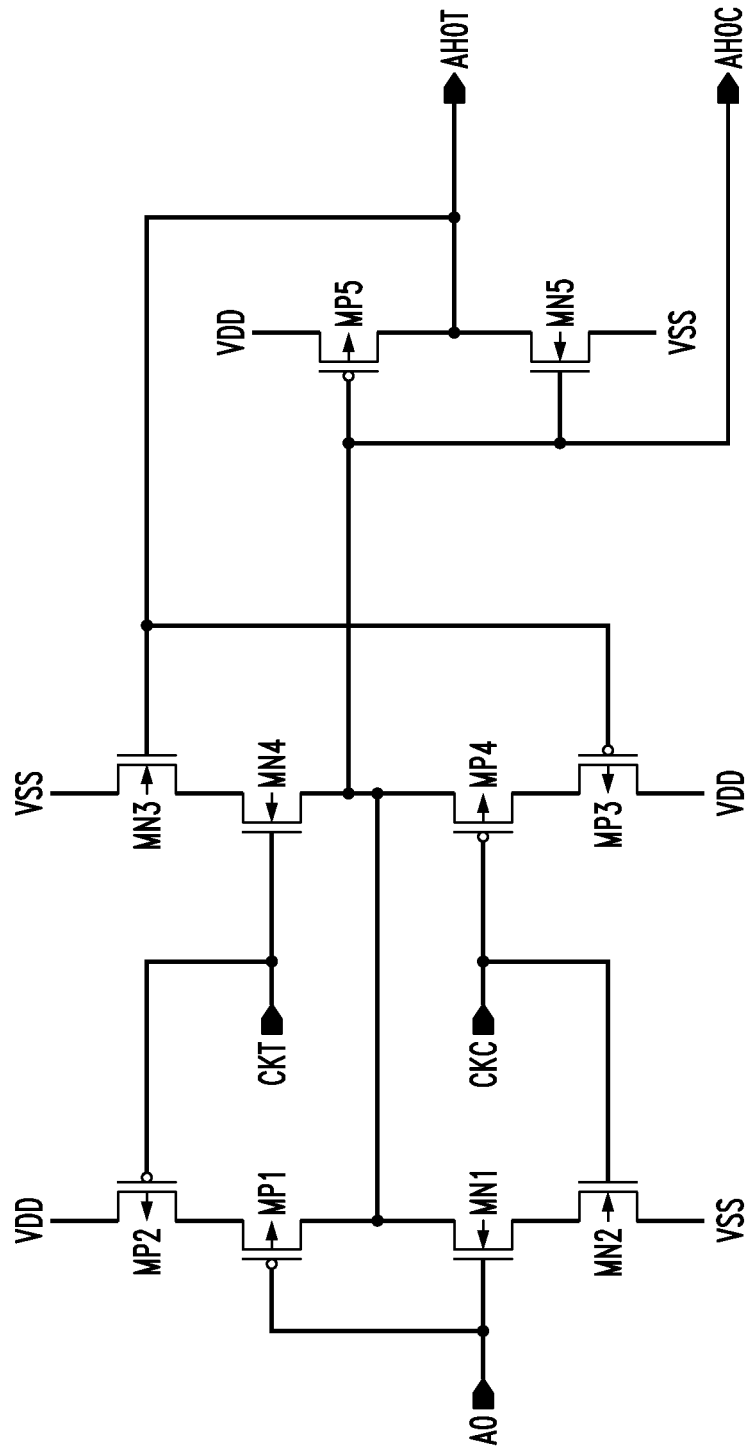
FIG. 4 is a circuit diagram of an address latch according to an embodiment of the invention.

In particular, as shown in FIG. 2, the first address latch 208-0 receives the address bit A0 as input, and generates address holding signals AH0T and AH0C, wherein AH0T has the same logic level as the address bit A0, and wherein AH0C has a logic level that is complementary to the logic level of the address bit A0 (e.g., if A0=1, AH0T=1 and AH0C=0). Similarly, the second address latch 208-1 receives the address bit A1 as input, and generates address holding signals AH1T and AH1C, wherein AH1T has the same logic level as the address bit A1, and wherein AH1C has a logic level that is complementary to the logic level of the address bit A1 (e.g., if A1=0, AH1T=0 and AH1C=1). In one embodiment of the invention as discussed in further detail below, the first and second address latches 208-0 and 208-1 are implemented with a circuit architecture as shown in FIG. 4.

Moreover, the first inverter 202 receives the address bit A0 as input and generates a complementary signal A0C, which is an inverted version of the address bit A0. The second inverter 204 receives the address bit A1 as input and generates a complementary signal A1C, which is an inverted version of the address bit A1. As shown in FIGS. 2 and 3, the address holding signals AH0T, AH0C, AH1T, AH1C (output from the address latch circuitry 208), the address bits A0 and A1, and the complementary address bits A0C and A1C (output from the inverters 202 and 204) are input to the first address pre-decode circuitry 210. As further shown in FIG. 3, each of the complex gate logic blocks 210-0, 210-2, 210-2, 210-3 receives as input a different combination of the address bits A0 and A1 and the complementary address bits A0C and A01, as well a different combination of the address holding signals AH0T, AH0C, AH1T, and AH1C, and generate respective address pre-decode input signals PD0, PD1, PD2 and PD3.

More specifically, as shown in FIG. 3, the first complex gate logic block 210-0 receives as input address bit combination A0/A1 and address holding signal combination AH0T/AH1T, wherein the address bits A0/A1 are processed by the first pre-decode logic portion 211-0 and the address holding signals AH0T/AH1T are processed by the second pre-decode logic portion 212-0. The second complex gate logic block 210-1 receives as input address bit combination A0C/A1 and address holding signal combination AH0C/AH1T, wherein the address bits A0C/A1 are processed by the first pre-decode logic portion 211-1 and the address holding signals AH0C/AH1T are processed by the second pre-decode logic portion 212-1. The third complex gate logic block 210-2 receives as input address bit combination A0/A1C and address holding signal combination AH0T/AH1C, wherein the address bits A0/A1C are processed by the first pre-decode logic portion 211-2 and the address holding signals AH0T/AH1C are processed by the second pre-decode logic portion 212-2. The fourth complex gate logic block 210-3 receives as input address bit combination A0C/A1C and the address holding signal combination AH0C/AH1C, wherein the address bits A0C/A1C are processed by the first pre-decode logic portion 211-3 and the address holding signals AH0C/AH1C are processed by the second pre-decode logic portion 212-3.

Moreover, each of the complex gate logic blocks 210-0, 210-1, 210-2, and 210-3 receives as input the internal clock signals CKT and CKC. The internal clock signals CKT and CKC operate to selectively activate and deactivate the first and second pre-decode logic portions of the complex gate logic blocks 210-0, 210-1, 210-2, 210-3 before and after the rising active edge of the clock signal CLK to generate and maintain respective address pre-decode input signals PD0, PD1, PD2 and PD3 at the output of the first address pre-decode circuitry 210. In one embodiment of the invention, the first and second pre-decode logic portions 211-0/212-0, 211-1/212-1, 211-2/212-2 and 211-3/212-3 in each of the complex gate logic blocks 210-0, 210-1, 210-2, 210-3 are implemented with a pair of multiplexed NOR gates that are selectively activated by the internal clock signals CKC and CKT, details of which will be explained below with reference to FIGS. 5 and 6, for example.

During the address setup phase of operation when the clock signal CLK is logic "0", the first address pre-decode circuitry 210 decodes the address bits A0 and A1 and complementary address signals A0C and A1C to generate a pre-decode input signal <PD0, PD1, PD2 and PD3> based on the logic levels of the address bits A0 and A1. In effect, the first address pre-decode circuitry 210 comprises a 2-to-4 decoder which decodes two address bits A0 and A1 to generate a "1 of 4" orthogonal set of pre-decode input signals, wherein only one of the pre-decode input signals PD0, PD1, PD2 and PD3 is asserted. In particular, during the setup phase of operation, the first pre-decode logic portions 211-0, 211-1, 211-2, and 211-3 are selectively activated (via the internal clock signals CKC and CKT) to decode their respective combinations of address inputs A0, A0C, A1 and A1C (as shown in FIG. 3) and generate a pre-decode input signal <PD0, PD1, PD2 and PD3> based on the logic levels of the address bits A0 and A1. During the setup phase of operation, the second pre-decode logic portions 212-0, 212-1, 212-2, 212-3 are deactivated.

Moreover, as noted above, during the setup phase operation, the address bits A0 and A1 are input to the respective address latches 208-0 and 208-1 of the address latch circuitry 208, wherein the address bit A0 and its complement are generated at the output of the first address latch 208-0 as the address holding signals AH0T and AH0C, respectively, and wherein the address bit A1 and its complement are generated at the output of the second address latch 208-1 as the address holding signals AH1T and AH1C, respectively. While respective combinations of the address holding signals AH0T, AH0C, AH1T and AH1C are applied at the inputs to the second pre-decode logic portions 212-0, 212-1, 212-2, 212-3 (in the combinations shown in FIG. 3), the combinations of address holding signals AH0T, AH0C, AH1T and AH1C are not decoded during the setup phase of operation since the second pre-decode logic portions 212-0, 212-1, 212-2 and 212-3 are deactivated while the clock signal CLK is logic "0".

At the end of the setup period and just prior to a rising edge of the clock signal CLK (e.g., time $t_2$ as shown in FIG. 2), the logic levels of the address holding signals AH0T, AH0C, AH1T and AH1C at the output of the address latch circuitry 208 are deemed stable, and the logic levels of the pre-decode input signals PD0, PD1, PD2 and PD3 at the output of the first address pre-decode circuitry 210 are deemed stable. Moreover, during the setup phase of operation of the address decoding circuit 200, since the clock signal CLK is logic "0", each pre-decode output signal PREDEC0, PREDEC1, PREDEC2, and PREDEC3 will be maintained at logic "0" such that the second pre-decode circuitry 220 is effectively disabled, wherein none of the pre-decode output signals PREDEC0, PREDEC1, PREDEC2, and PREDEC3 are asserted (i.e., the output of the second pre-decode circuitry 220 is "0 of 4").

Once the clock signal CLK transitions to logic "1", the address decoding circuit 200 enters into an address "hold" period of operation (e.g., starting from time period $t_2$ to $t_3$ as shown in FIG. 2). When the clock signal CLK transitions to logic "1", address holding signals AH0T/AH0C and AH1T/AH1C at the output of the respective first and second address latches 208-0 and 208-1 remain fixed, irrespective of any change in the logic levels of the address bits A0 and A1. Moreover, when the clock signal CLK transitions to logic "1", the first pre-decode logic portions 211-0, 211-1, 211-2, and 211-3 in the respective complex gate logic blocks 210-0, 210-1, 210-2, and 210-3 are deactivated, while the second pre-decode logic portions 212-0, 212-1, 212-2, and 212-3 are activated to decode the respective input combinations of address holding signals AH0T, AH0C, AH1T, and AH1C.

Since the address holding signals AH0T, AH0C, AH1T and AH1C have the same logic levels of the address signals A0, A0C, A1 and A1C, respectively, and since the first and second pre-decode logic portions in the respective complex gate logic blocks 210-0, 210-1, 210-2, and 210-3 implement the same logic, the logic levels of the pre-decode input signals PD0, PD1, PD2 and PD3 at the output of the first address pre-decode circuitry 210 are not changed, but rather maintained at the same logic levels (following the setup period) by operation of the second pre-decode logic portions 212-0, 212-1, 212-2, and 212-3 decoding their respective combinations of address holding signals AH0T, AH0C, AH1T and AH1C (as shown in FIG. 3). While the clock signal CLK remains at logic "1", the pre-decode input signals PD0, PD1, PD2 and PD3 will remain constant at the output of the first address pre-decode circuitry 201. This allows the second pre-decode circuitry 220 to safely sample the pre-decoder input signals PD0, PD1, PD2 and PD3 at the output of the first address pre-decode circuitry 210 and generate the pre-decode output signals PREDEC0, PREDEC1, PREDEC2, and PREDEC3 at the output of the second address pre-decode circuitry 220.

In general, the embodiment of the address decoder circuit 200 shown in FIG. 2 provides a reduction in the setup time as compared to conventional circuits in which address inputs are applied to address latches, wherein true and complement outputs of the address latches then drive the inputs of pre-decoder logic, and wherein outputs of the pre-decoder logic are sampled by the clock signal CLK to begin a memory array access. In conventional designs, the setup time would be the minimum time required for an address signal A to serially propagate through the setup path, i.e., through the address latch to generate a true and complement of the address signal A, and then through the pre-decoder which decodes the latch output signals to generate a stable pre-decode input signal PD. In a conventional design, assuming that the number of gate delays through the address latch path is m and the number of gate delays through the pre-decoder path is n, the minimum setup time along the serial path would be m+n. For instance, assuming that the gate delays are m=2 and n=1, the minimum setup time would be 3 gate delays.

In contrast, in the embodiment of FIG. 2, the minimum setup time is the greater of m or n. Indeed, in FIG. 2, the address latch path is placed in parallel with the pre-decoder path, wherein a clock multiplexer is integrated into the first address pre-decode circuitry logic. When the clock signal CLK is logic "0", the address inputs are applied directly to the first address pre-decode circuit 210, with the longest path (n gate delays) including the gate delay of the input inverter (e.g., inverter 202 or 204) and the gate delay of the first pre-decode logic portion (e.g., 211-0, 211-2, 211-2, or 21103). In parallel with the pre-decode path, the address propagates through the address latches with the longest path (m gate delays) including a number of gate delays through a given address latch (e.g., 208-0 or 208-1). In this regard, assuming that in the address decoder circuit 200 of FIG. 2, the gate delays are m=2 and n=2. In such instance, the minimum setup time would be 2 gate delays, which is less than the conventional embodiment described above. Moreover, since the pre-decode input signals PD0, PD1, PD2, PD3 at the output of the first address pre-decode circuitry 210 are maintained at the same logic levels (by operation of the second pre-decode logic portions 212-0, 212-1, 212-2, 212-3) when the clock signal CLK transitions to logic "1", there is no added gate delay in the pre-decode path to maintain stable values pre-decode input signals PD0, PD1, PD2, PD3 for the hold period.

While the address latch circuitry 208 and first address pre-decode circuitry 210 are depicted in block diagram form in FIG. 2, it is to be understood that these circuits can be implemented with various types of circuitry and logic that is suitable to implement the circuit functions as described herein. For example, FIG. 4 is a circuit diagram of an address latch according to an embodiment of the invention. In particular, FIG. 4 illustrates an embodiment of the first address latch 208-0 shown in FIG. 2, which receives as input the address bit A0. The second address latch 208-1 of the address latch circuitry 208 in FIG. 2 has the same circuit architecture as shown in FIG. 4, except that the second address latch 208-1 receives as input the address bit A1. Referring to FIG. 4, the address latch 208-0 comprises a PMOS transistor MP1 and an NMOS transistor MN1 which form a first (gated) inverter, and a PMOS transistor MP2 and NMOS transistor MN2, which operate as switches that are controlled by clock signals CKT and CKC applied to their respective gate terminals. The first address latch 208-0 further comprise a PMOS transistor MP3 and NMOS transistor MN3 which form a second (gated) inverter, and a PMOS transistor MP4 and NMOS transistor MN4 which operate as switches that are controlled by clock signals CKC and CKT applied to their respective gate terminals. The first address latch 208-0 further comprises a PMOS transistor MP5 and an NMOS transistor MN5, which form a third inverter at an output of the first address latch 208-0.

The address bit A0 is commonly applied to an input (gate terminals) of the first inverter (MP1/MN1). An output of the first inverter (MP1/MN1) is connected to an output of the second gated inverter (MP3/MP4), and commonly connected to an input (gate terminals) of the third inverter (MP5/MN5). An output of the third inverter (MP5/MN5) is commonly connected to an input (gate terminals) of the second inverter (MN3/MP3). The true address holding signal AH0T is generated at an output of the third inverter (MP5/MN5), and the complementary address holding signal AH0C is generated at an output of the first inverter (MP1/MN1). The first address latch 208-0 is a level-sensitive latch, which generally operates as follows.

When the clock signal CLK is logic 0 (during a setup phase), the complementary clock signal CKC will be logic 1 and the true clock signal CKT will be logic 0. In this state, the PMOS transistor MP2 and NMOS transistor MN2 will both be turned on (activated), and the PMOS transistor MP4 and NMOS transistor MN4 will both be turned off (deactivated). As such, the output of the first inverter (MP1/MN1) will be coupled to the input of the third inverter (MP5/MN5), and decoupled from the output of the second inverter (MP3/MN3). In this state, the first address latch 208-0 is "open" and allows the input address bit A0 to pass through the address latch 208-0 to generate the address holding signals AH0T and AH0C, wherein the signal AH0T has the same logic level as the address bit A0, and wherein the signal AH0C has a logic level that is complementary to the logic level of the address bit A0 (e.g., if A0=1, AH0T=1 and AH0C=0).

When the clock signal CLK transitions to logic 1 (subsequent the setup phase), the complementary clock signal CKC will be logic 0 and the true clock signal CKT will be logic 1. In this state, the PMOS transistor MP2 and NMOS transistor MN2 will both be turned off (deactivated), and the PMOS transistor MP4 and NMOS transistor MN4 will both be turned on (activated). As such, the first inverter (MP1/MN1) is essentially deactivated, thereby decoupling the address bit input from the latch output (address latch 208-0 is "closed"). When the address latch 208-0 is closed, the address holding signals AH0T and AH0C at the output of the address latch 208-0 are retained by a latch feedback path provided by the second inverter (MP3/MN3), regardless of any subsequent switching of the logic level of the address bit A0. For example, if AH0T is logic 0 and AH0C is logic 1, the PMOS transistor MP3 will be turned on, such that the output of the second inverter (MP3/MN3) and input of the third inverter (MP5/MN5) will be maintained at logic 1 irrespective of the logic level of the input address bit A0.

Accordingly, from the above description of FIG. 4, it can be seen that first address latch 208-0 has a minimum of two gate delays to generate stable address holding signals AH0T and AH0C at the output of the first address latch 208-0. In other words, to generate a stable address holding signal AH0T at the output of the third inverter (MP5/MN5), the input signal (address bit A0) must pass through the first inverter (MP1/MN1) and the third inverter (MP5/MN5) to generate the signal AH0T, wherein each of said first and third inverters provides one gate delay in the setup time of the address latch path. Thus, the address latch of FIG. 4 provides a minimum of two gate delays to generate stable address holding signals AH0T and AH0C at the output thereof.

Figure 5:
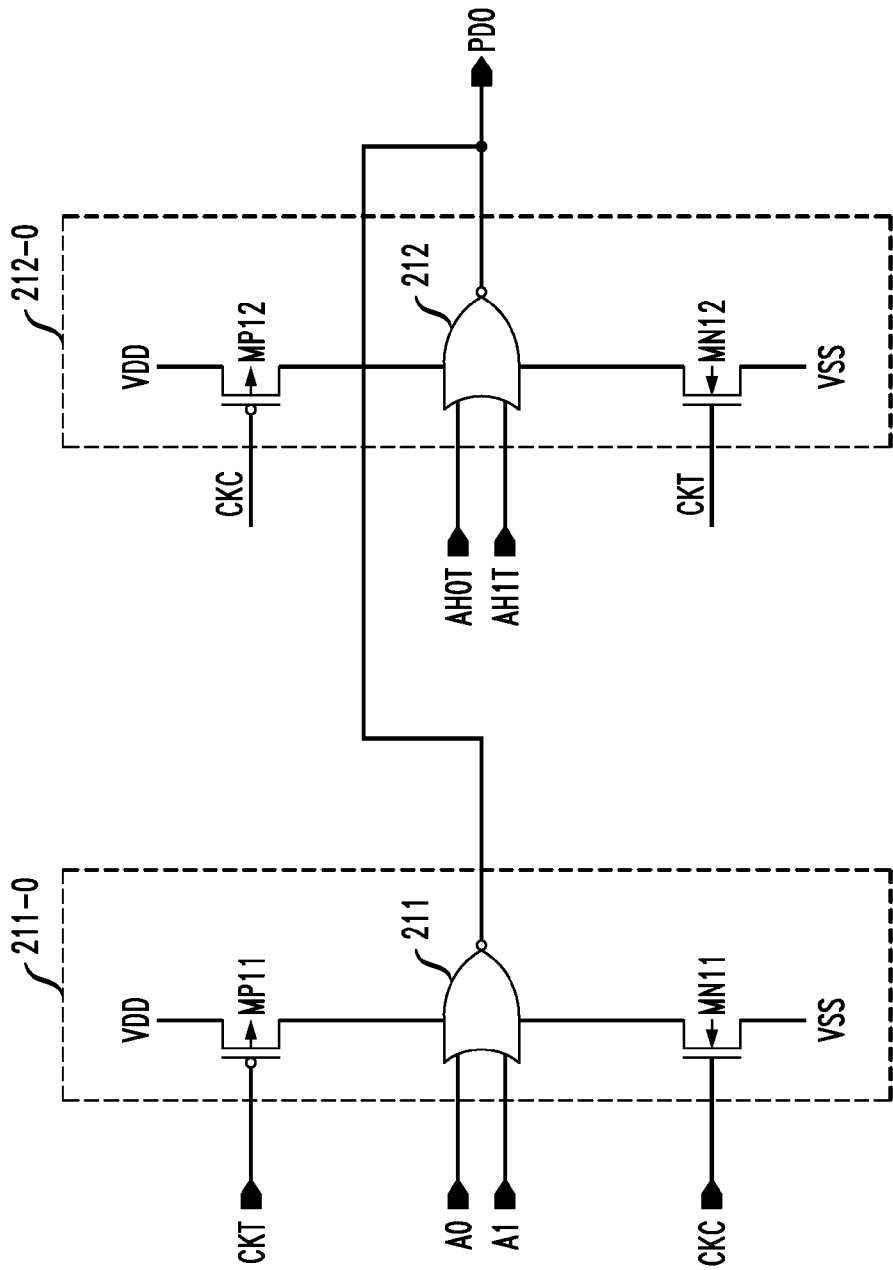
FIG. 5 is a gate-level diagram of a complex gate logic block of the pre-decoding circuitry of FIG. 3, according to an embodiment of the invention.

FIG. 5 is a gate-level diagram of a complex gate logic block of the pre-decoding circuitry of FIG. 3, according to an embodiment of the invention. In particular, FIG. 5 illustrates an embodiment of the first complex gate logic block 210-0 and the first and second pre-decode logic portions 211-0 and 212-0, as shown in FIG. 3, which receives as input the address bits A0 and A1, and the address holding signals AH0T and AH1T, and generates a pre-decode input signal PD0. The other complex gate logic blocks 210-1, 210-2 and 210-3 of the first address pre-decode circuitry 210 have the same circuit architecture as shown in FIG. 5, except that the complex gate logic blocks 210-1, 210-2 and 210-3 receive as input different combinations of the address bits and address holding signals, as discussed above with reference to FIG. 3.

Referring to FIG. 5, the first pre-decode logic portion 211-0 of the first complex gate logic block 210-0 comprises a first NOR gate 211, a PMOS transistor MP11, and an NMOS transistor MN11. The second pre-decode logic portion 212-0 comprises a second NOR gate 212, PMOS transistor MP12, and NMOS transistor MN12. The first NOR gate 211 has two input terminals that receive respective address bits A0 and A1 as input, and an output terminal connected to the PD0 output. The second NOR gate 212 has two input terminals that receive respective address holding signals AH0T and AH1T, and an output terminal connected to the PD0 output. The PMOS transistor MP11 and NMOS transistor MN11 operate as switches that are controlled by respective clock signals CKT and CKC, which are applied to their respective gate terminals. Moreover, the PMOS transistor MP12 and NMOS transistor MN12 operate as switches that are controlled by respective clock signals CKC and CKT, which are applied to their respective gate terminals.

The first complex gate logic block 210-0 shown in FIG. 5 essentially comprises a pair of multiplexed NOR gates, wherein the first and second NOR gates 211 and 212 are selectively activated based on the logic levels of the internal clock signals CKT and CKC. In particular, during a setup phase in which the clock signal CLK is logic "0" (where the clock signal CKC is logic "1" and the clock signal CKT is logic "0"), the NMOS transistor MN11 and PMOS transistor MP11 are both turned on (activated), such that the first NOR gate 211 is active. Moreover, the NMOS transistor MN12 and PMOS transistor MP12 are both turned off (deactivated), such that the second NOR gate 212 is deactivated. In this state, the logic level at the output of the first NOR gate 211 will be the logic level of the PD0 output.

On the other hand, when the clock signal CLK transitions to logic "1" and enters an address hold phase (where the clock signal CKC is logic "0" and the clock signal CKT is logic "1"), the NMOS transistor MN11 and PMOS transistor MP11 are both turned off (deactivated), such that the first NOR gate 211 is deactivated. Moreover, the NMOS transistor MN12 and PMOS transistor MP12 are both turned on (activated), such that the second NOR gate 212 is activated. In this state, the logic level at the output of the second NOR gate 212 will be the logic level of the PD0 output.

Figure 6:
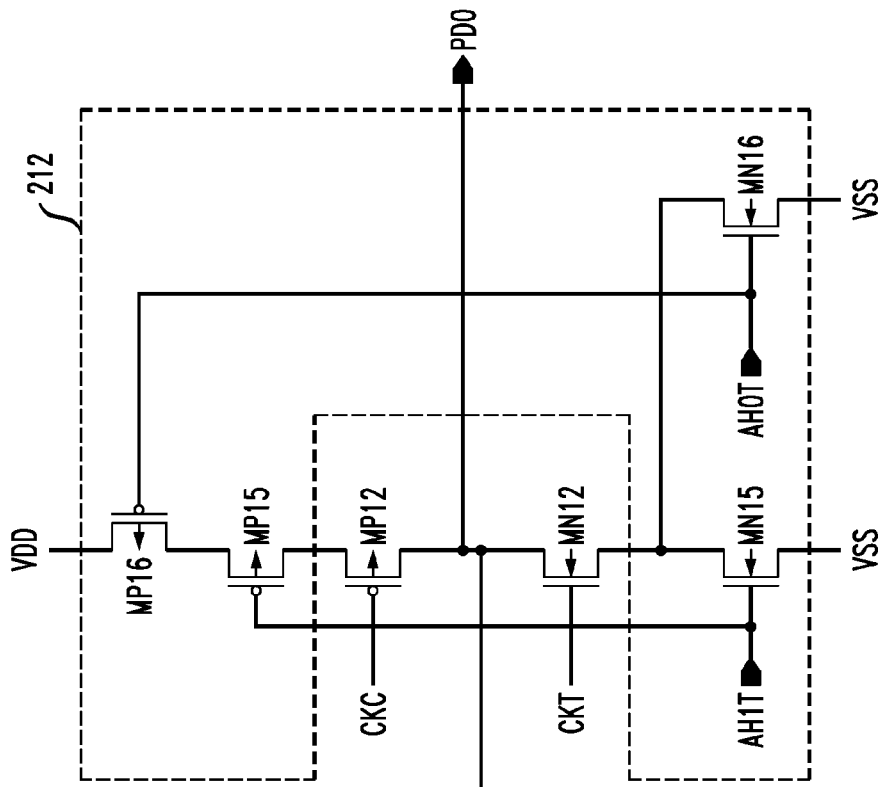
FIG. 6 is a circuit diagram of the complex gate logic block shown in FIG. 5, according to an embodiment of the invention.
Figure 6:
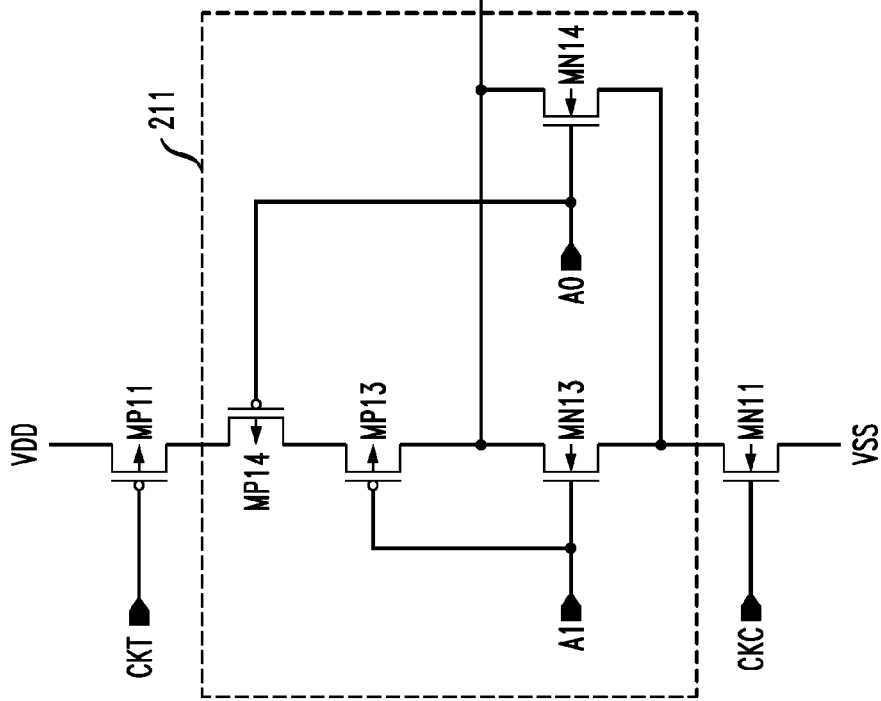

FIG. 6 is a circuit diagram of the complex gate logic block shown in FIG. 5, according to an embodiment of the invention. As shown in FIG. 6, the first NOR gate 211 comprises NMOS transistors MN13 and MN14, and PMOS transistors MP13 and MP14. Similarly, the second NOR gate 212 comprises NMOS transistors MN15 and MN16, and PMOS transistors MP15 and MP16. When the first NOR gate 211 is active (transistors MP11 and MN11 are turned on) and the second NOR gate 212 is inactive (transistors MP12 and MN12 are turned off), the output of the first NOR gate 211 (PD0 output) will be logic "1" when both address bits A1 and A0 are logic "0". In this state, NMOS transistors MN13 and MN14 will be turned off and PMOS transistors MP13 and MP14 will both be turned on, thereby pulling the output node PD0 to VDD. On the other hand, when either address bit A1 or A0 is a logic "1", the output of the first NOR gate 211 (PD0 output) will be logic "0". In this state, the PD0 node will be cut-off from VDD (since one of the PMOS transistors MP13 and MP14 will be turned off), and pulled down to VSS (since one of the NMOS transistors MN13 and MN14 will be turned on).

Similarly, when the first NOR gate 211 is inactive (transistors MP11 and MN11 are turned off) and the second NOR gate 212 is active (transistors MP12 and MN12 are turned on), the output of the second NOR gate 212 (PD0 output) will be logic "1" when both address holding signals AH1T and AH0T are logic "0". In this state, NMOS transistors MN15 and MN16 will be turned off and PMOS transistors MP15 and MP16 will both be turned on, thereby pulling the output node PD0 to VDD. On the other hand, when either of the address holding signals AH1T or AH0T is a logic "1", the output of the second NOR gate 212 (PD0 output) will be logic "0". In this state, the PD0 node will be cut-off from VDD (since one of the PMOS transistors MP15 and MP16 will be turned off), and pulled down to VSS (since one of the NMOS transistors MN15 and MN16 will be turned on).

As shown in FIGS. 5 and 6, the logic for the first and second pre-decode portions 211-0 and 212-0 are similar. Moreover, as noted above, the logic levels of the address bits A0 and A1 that are input to, and decoded by, the first pre-decode portion 211-0 during a given setup period are the same as the logic levels of the respective address holding signals AH0T and AH1T that are input to, and decoded by, the second pre-decode logic portion 212-0 after the given setup period. In this regard, the logic level of the pre-decode input signal PD0 which is generated at the output of the first complex gate logic block 210-0 during the setup period will not change, but will rather be driven at the same logic level (following the given setup period) by operation of the second pre-decode logic portion 212-0.

For example, assume that in a given setup period, each address bit A0 and A1 is at logic level "1" and that each address holding signal AH0T and AH1T is at logic level "1". Since only the first pre-decode logic portion 211-0 is active during the setup period, the PD0 output will be driven to logic "0" by operation of the first NOR gate 211. When the setup period ends and the clock signal CLK transitions to logic "1", the first pre-decode logic portion 211-0 is deactivated and the second pre-decode logic portion 212-0 is activated. Since each address holding signal AH0T and AH1T is at logic level "1", the PD0 output will be maintained at the logic level "0" by operation of the second NOR gate 212 with no delay.

While the first and second pre-decode logic portions 211-0 and 212-0 of FIG. 5 have the same logic function, in one embodiment shown in FIG. 6, the switching transistors that selectively activate and deactivate the first NOR gate 211 and second NOR gate 212 are positioned differently to optimize circuit performance. For example, with the first NOR gate 211, the PMOS transistor MP11 and NMOS transistor MN11 have a respective source and drain terminal connected directly to respective power supply nodes VDD and VSS. With the second NOR gate 212, the PMOS transistor MP12 and NMOS transistor MN12 have a respective drain terminals connected directly to the output node PD0. The orientation of the switching transistors MP11 and MN11 (close to power supply nodes) optimizes setup time performance when selectively activating the first NOR gate 211 during the setup phase of operation. On the other hand, the orientation of the switching transistors MP12 and MN12 (close to output node PD0) serves to isolate the inter-nodal capacitances on the output node PD0 from the components of the second NOR gate 212 when the second NOR gate 212 is inactive.

With the address decoder circuit embodiment of FIG. 2 implemented with the address latch circuitry shown in FIG. 4 and the pre-decode circuitry 210 shown in FIG. 5, it can be seen that the setup time is reduced to no more than 2 gate delays. For instance, in an address latch path, as discussed above with reference to FIG. 4, the address latch (e.g., address latch 208-0) provides a minimum of two gate delays to generate stable address holding signals (e.g., AH0T and AH0C) at the output thereof. Moreover, in a parallel pre-decode path, an input inverter (e.g., inverters 202, 204 in FIG. 2) provides one gate delay, while the first pre-decode logic portion (e.g., 211-0, 211-1, 211-2, 211-3) in the first address pre-decode circuitry 210 provides a second gate delay (total of two gate delay). In this regard, the maximum gate delay in any of the corresponding parallel address latch/pre-decode paths is at most 2 gate delays, thereby resulting in a minimum setup time of 2 gate delays.

In the embodiments discussed above, while the number of transistors used to implement the first address pre-decode circuitry 210 may be greater than the number of transistors that are used in conventional pre-decode circuitry, embodiments of the invention provide many advantages which provide desirable tradeoffs. For instance, since the address latches are no longer in the setup time critical path, transistor sizes in the address latches can be scaled back to mitigate some of the area increase due to the added address pre-decode circuit components. Moreover, at chip level timing, if the address latch path is in the critical cycle time path, then the improvement in setup time provided by embodiments of the invention as discussed here can improve cycle time or make it easier to close timing (i.e., allow the critical cycle time path to reach a minimum cycle time target).

Other proposed solutions for reducing the setup time include placing latch circuitry after the address pre-decode circuitry to latch the pre-decoded address bits (as opposed to the address bits). However, these solutions are highly problematic in that the state of the latch circuitry cannot be controlled upon start-up. As a result, the output of the latch circuitry can cause activation of multiple wordlines or columns upon start-up, which results in a large crowbar current condition that can damage the electronics and power grid. Consequently, it is more desirable to place address pre-decode circuitry after an address latch, as in the embodiment shown in FIG. 2. In accordance with embodiments of the invention, a reduction in the setup time is achieved by keeping the address latch before the address pre-decode circuitry, while removing the address latch from the critical setup time path while guaranteeing the output of the address pre-decode circuitry is an orthogonal set (e.g., 1 of 4 output) at all times, even at startup. Indeed, although the address latch circuitry is removed from the critical setup path, i.e., the address inputs are directly decoded by the first pre-decode logic portions 211-0, 211-1, 211-2, and 211-3 of the first address pre-decode circuitry 210 during the setup period, the output of the latch circuitry 208 in FIG. 2 is still decoded by the second pre-decode logic portions 212-0, 212-1, 212-2, and 212-3 of the first address pre-decode circuitry 210, which guarantees that the output of the pre-decode circuitry (blocks 210 and 220) will always be 1 of 4, even on power up.

It should be noted that use of PMOS transistors and NMOS transistors in the particular embodiments of the address latches and pre-decode circuitry as described above is by way of illustrative example. In other embodiments, the conductivity types of certain ones of the various transistors may be reversed, as would be appreciated by one skilled in the art, in conjunction with other straightforward modifications of the circuitry arrangements. Moreover, although FIG. 2 depicts first and second address pre-decode circuitry 210 and 220, in other embodiments of the invention, the address decoder circuit 200 of FIG. 2 can include additional downstream decoding circuitry wherein the pre-decode output signals PREDEC0, PREDEC1, PREDEC2, and PREDEC3 at the output of the second address pre-decode circuitry 220 can be ANDed with the outputs of other 1 or 4 pre-decode circuitry to obtain deeper address spaces, as is readily understood by those of ordinary skill in the art.

A given memory device with address decoder circuitry configured in accordance with the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory implemented within a microprocessor, digital signal processor (DSP), application-specific integrated circuit (ASIC), field-programmable gate array (FPGA) or other type of processor or integrated circuit device.

Figure 7:
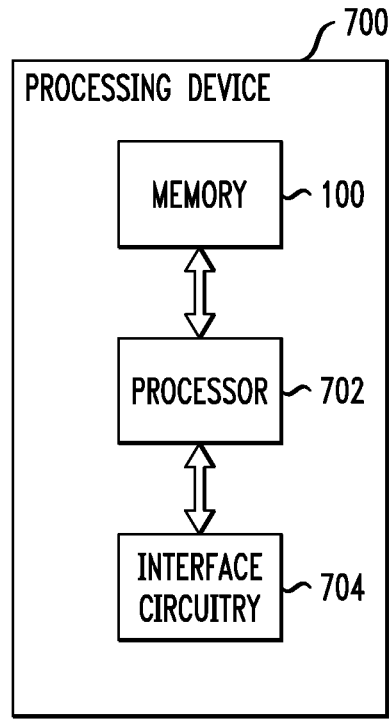
FIG. 7 is a block diagram of a processing device which incorporates the memory device of FIG. 1.

FIG. 7 shows an example of a processing device 700 which incorporates the memory device 100 of FIG. 1. In this embodiment, the memory device 100 is coupled to a processor 702. The processing device further includes interface circuitry 704 coupled to the processor 702. The processing device 700 may comprise, for example, a computer, a server or a portable communication device such as a mobile telephone. The interface circuitry 704 may comprise one or more transceivers for allowing the device 600 to communicate over a network.

Figure 8:
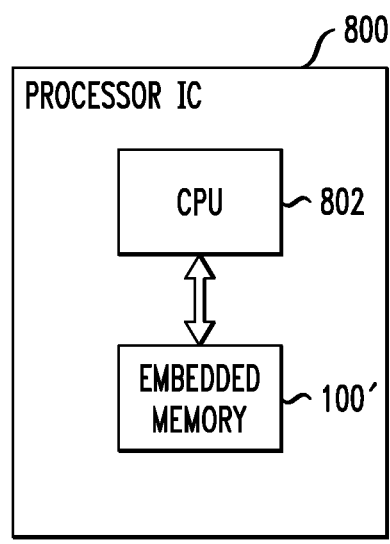
FIG. 8 is a block diagram of a processor integrated circuit which incorporates the memory device of FIG. 1 as an embedded memory.

Alternatively, processing device 700 may comprise a microprocessor, DSP or ASIC, with processor 702 corresponding to a central processing unit (CPU) and memory device 100 providing at least a portion of an embedded memory of the microprocessor, DSP or ASIC. FIG. 8 shows an example of an arrangement of this type, with processor integrated circuit 800 incorporating the memory device of FIG. 1 as an embedded memory 100'. The embedded memory 100' in this embodiment is coupled to a CPU 802.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Although embodiments of the invention have been described herein with reference to the accompanying drawings, it is to be understood that embodiments of the invention are not limited to the described embodiments, and that various changes and modifications may be made by one skilled in the art resulting in other embodiments of the invention within the scope of the following claims.

What is claimed is:

1. A memory device comprising:
a memory array comprising a plurality of memory cells; and
a decoder to decode an address for accessing a memory cell in the memory array, wherein the decoder comprises:
address latch circuitry which receives as input an address signal and generates address holding signals during a setup period of the memory array, wherein the address latch circuitry latches the address holding signals during an address hold period following the setup period;
inverter circuitry which receives as input the address signal and generates a complementary address signal; and
first address pre-decode circuitry which receives as input the address signal, the complementary address signal and the address holding signals, wherein the first address pre-decode circuitry decodes the address signal and the complementary address signal during the setup period to generate a first pre-decode address signal at an output of the first address pre-decode circuitry, and wherein the first address pre-decode circuitry decodes the address holding signals during the address hold period to maintain the first pre-decode address signal at the output of the first address pre-decode circuitry.

2. The memory device of claim 1, wherein the decoder further comprises second address pre-decode circuitry that samples the first pre-decode address signal output from the first address pre-decode circuitry using a clock signal that is asserted during the address hold period to generate a second pre-decode signal at the output of the second address pre-decode circuitry.

3. The memory device of claim 1, wherein the first address pre-decode circuitry comprise a first pre-decode logic portion and a second pre-decode logic portion, wherein the first pre-decode logic portion receives as input the address signal and the complementary address signal, and wherein the second pre-decode logic portion receives as input the address holding signals.

4. The memory device of claim 3, wherein during the setup period, the second pre-decode logic portion is deactivated and the first pre-decode logic portion is activated to generate the first pre-decode address signal at the output of the first address pre-decode circuitry, and wherein during the address hold period, the first pre-decode logic portion is deactivated and the second pre-decode logic portion is activated to maintain the first pre-decode address signal at the output from the first address pre-decode circuitry.

5. The memory device of claim 3, wherein the first pre-decode logic portion and the second pre-decode logic portion comprise the same logic.

6. The memory device of claim 3, wherein the first pre-decode logic portion and the second pre-decode logic portion comprise a pair of multiplexed NOR gates.

7. The memory device of claim 1, wherein the address signal in an n-bit signal and wherein the first address pre-decode circuitry generates a $2^n$-bit first pre-decode address signal.

8. The memory device of claim 1, wherein the setup period is no more than two gate delays.

9. An integrated circuit comprising the memory device of claim 1.

10. A processing device comprising the memory device of claim 1.

11. A decoder circuit to decode an address for accessing a memory cell in a memory array, the decoder comprising:
address latch circuitry which receives as input an address signal and generates address holding signals during a setup period of the memory device, wherein the address latch circuitry latches the address holding signals during an address hold period following the setup period;
inverter circuitry which receives as input the address signal and generates a complementary address signal; and
first address pre-decode circuitry which receives as input the address signal, the complementary address signal and the address holding signals, wherein the first address pre-decode circuitry decodes the address signal and complementary address signal during the setup period to generate a first pre-decode address signal at an output of the first address pre-decode circuitry, and wherein the first address pre-decode circuitry decodes the address holding signals during the address hold period to maintain the first pre-decode address signal at the output of the first address pre-decode circuitry.

12. The decoder circuit of claim 11, further comprising second address pre-decode circuitry that samples the first pre-decode address signal output from the first address pre-decode circuitry using a clock signal that is asserted during the address hold period to generate a second pre-decode signal at the output of the second address pre-decode circuitry.

13. The decoder circuit of claim 11, wherein the first address pre-decode circuitry comprise a first pre-decode logic portion and a second pre-decode logic portion, wherein the first pre-decode logic portion receives as input the address signal and the complementary address signal, and wherein the second pre-decode logic portion receives as input the address holding signals.

14. The decoder circuit of claim 13, wherein during the setup period, the second pre-decode logic portion is deactivated and the first pre-decode logic portion is activated to generate the first pre-decode address signal at the output of the first address pre-decode circuitry, and wherein during the address hold period, the first pre-decode logic portion is deactivated and the second pre-decode logic portion is activated to maintain the first pre-decode address signal at the output from the first address pre-decode circuitry.

15. The decoder circuit of claim 13, wherein the first pre-decode logic portion and the second pre-decode logic portion comprise the same logic.

16. The decoder circuit of claim 13, wherein the first pre-decode logic portion and the second pre-decode logic portion comprise a pair of multiplexed NOR gates.

17. The decoder circuit of claim 11, wherein the decoder circuit is a column decoder to control bitlines of a memory array.

18. The decoder circuit of claim 11, wherein the decoder circuit is a row decoder to control wordlines of a memory array.

19. The decoder of claim 11, wherein the setup period is no more than two gate delays.

20. An integrated circuit comprising the decoder circuit of claim 11.

21. A method for accessing a memory cell in a memory array, comprising:
receiving as input an address signal;

generating address holding signals during a setup period of the memory array based on the address signal;
latching the address holding signals during an address hold period following the setup period;
generating a complementary address signal of the address signal;
decoding the address signal and the complementary address signal during the setup period to generate a first pre-decode address signal; and
decoding the address holding signals during the address hold period to maintain the first pre-decode address signal for a memory access operation.

* * * * *